United States Patent
Pereira Da Silva, Jr.

(10) Patent No.: US 9,954,485 B2
(45) Date of Patent: Apr. 24, 2018

(54) AMPLITUDE DETECTION WITH COMPENSATION

(71) Applicant: FREESCALE SEMICONDUCTOR, INC., Austin, TX (US)

(72) Inventor: Edevaldo Pereira Da Silva, Jr., Austin, TX (US)

(73) Assignee: NXP USA, INC., Austin, TX (US)

( * ) Notice: Subject to any disclaimer, the term of this patent is extended or adjusted under 35 U.S.C. 154(b) by 100 days.

(21) Appl. No.: 15/149,600

(22) Filed: May 9, 2016

(65) Prior Publication Data

US 2017/0324377 A1 Nov. 9, 2017

(51) Int. Cl.
H03L 5/00 (2006.01)
H03B 5/12 (2006.01)
H03K 5/24 (2006.01)
H03K 5/22 (2006.01)

(52) U.S. Cl.
CPC ............ *H03B 5/1206* (2013.01); *H03B 5/12* (2013.01); *H03B 5/1228* (2013.01); *H03K 5/22* (2013.01); *H03K 5/24* (2013.01); *H03K 5/2481* (2013.01); *H03L 5/00* (2013.01)

(58) Field of Classification Search
CPC .......... H03L 5/00; H03K 5/22; H03K 5/2481; H03K 5/24; H03B 5/12; H03B 5/1206; H03B 5/1228
USPC ........ 331/182, 175, 183; 327/58, 59, 60, 72, 327/73, 65
See application file for complete search history.

(56) References Cited

U.S. PATENT DOCUMENTS

| | | |
|---|---|---|
| 5,331,210 A | 7/1994 | McCarroll |
| 6,278,338 B1 | 8/2001 | Jansson |
| 6,653,908 B1 | 11/2003 | Jones |
| 7,098,753 B1 | 8/2006 | Dumitrescu et al. |
| 7,196,592 B2 | 3/2007 | Shi et al. |
| 7,439,776 B1 * | 10/2008 | Terrovitis .............. G01R 19/04 327/58 |
| 2005/0212611 A1 | 9/2005 | Muthali et al. |
| 2006/0158271 A1 | 7/2006 | Juang et al. |
| 2011/0050285 A1 | 3/2011 | Su et al. |
| 2015/0028956 A1 | 1/2015 | Okamoto |

OTHER PUBLICATIONS

Maxim, A., "A multi-rate 9.953-12.5Ghz 0.2 um SiGe BICMOS LC oscillator with -120dBc Hz phase noise at 1MHz offset using a variable resistor based varactor", in the Proceedings of the 2005 Symposium on VLSI Circuits, Digest of Technical Papers, pp. 202-205, Jun. 16-18, 2005.

\* cited by examiner

*Primary Examiner* — Arnold Kinkead
(74) *Attorney, Agent, or Firm* — David G. Dolezal (57) ABSTRACT

A circuit including an amplitude detector. The amplitude detector includes an input to receive a signal having an amplitude voltage and a first pair of transistors configured in parallel. The input is coupled to the control terminal of at least one transistor of the first pair. The amplitude detector includes a first node providing a voltage indicative of the amplitude voltage. The first node is in series with each of the first pair of transistors. The circuit includes a compensation circuit. The compensation circuit includes a second pair of transistors configured in parallel and a second node. The second node is coupled in series with each transistor of the second pair. The circuit includes an amplifier including a first amplifier input coupled to the first node and a second amplifier input coupled to the second node.

20 Claims, 4 Drawing Sheets

AMPLITUDE DETECTION WITH COMPENSATION

BACKGROUND OF THE INVENTION

Field of the Invention

This invention relates to amplitude detection circuits and systems that utilize amplitude detection circuits.

Description of the Related Art

Amplitude detection circuits can be used to detect the amplitude voltage of a signal. For example, an amplitude detection circuit can be used to detect the amplitude of an oscillator output signal. In some systems, the amplitude detected by an amplitude detector can be compared with a reference value to adjust the amplitude of the oscillator circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, an amplitude detection circuit can include a compensation circuit to compensate for inefficiencies, non ideal characteristics, temperature variation, and/or process variation of the devices of the amplitude detection circuit.

Amplitude detectors are utilized for detecting the amplitude of a signal. They can be used in oscillator systems (e.g. clocks) to control the amplitude voltage of the oscillator signal. Based on the signal type and configuration, some amplitude detectors can detect the peak voltage of a signal (e.g. a peak detector). However, with other types of amplitude detection circuits, the actual amplitude detected by the detection circuit for some signals (e.g. a sinusoidal signal) is less than the peak voltage (e.g. the RMS voltage of the signal).

Ideally, an amplitude detector should accurately measure the amplitude voltage of a signal even at relatively low voltages or high frequencies. However, non ideal characteristics of the devices of the amplitude detector can cause the circuit to deviate from ideal performance.

For example, amplitude detectors that are implemented with MOSFETS can suffer from issues due to the relatively lower transconductance of a MOSFET. With some configurations, transistors coupled in parallel for receiving differential input signals may undesirably conduct simultaneously during a portion of an oscillator signal cycle. The effects of simultaneous transistor conduction is worse in a detector circuit implemented with MOSFETS due to their lower transconductance. These non-ideal characteristics of a MOSFET can affect an amplitude detector in the detection of an amplitude of a low voltage signal (e.g. 300 mV and lower).

As set forth in embodiments described below, an amplitude detection circuit includes a compensation circuit that includes devices equivalent to devices of the amplitude detector to compensate for the non ideal characteristics of the devices. In some embodiments, both the amplitude detector and the compensation circuit include transistor pairs coupled in parallel that each produce a voltage that is used to provide a signal indicative of the amplitude voltage. In some embodiments, that signal is used to adjust one of the voltages of the amplitude detector or compensation circuit to equal the other voltage in order to compensate for the output of the system. In some embodiments, the amplitude voltage of the oscillator is proportional to the voltage differential across the control terminals of the transistor pair of the compensation circuit during a steady state condition.

Figure 1:
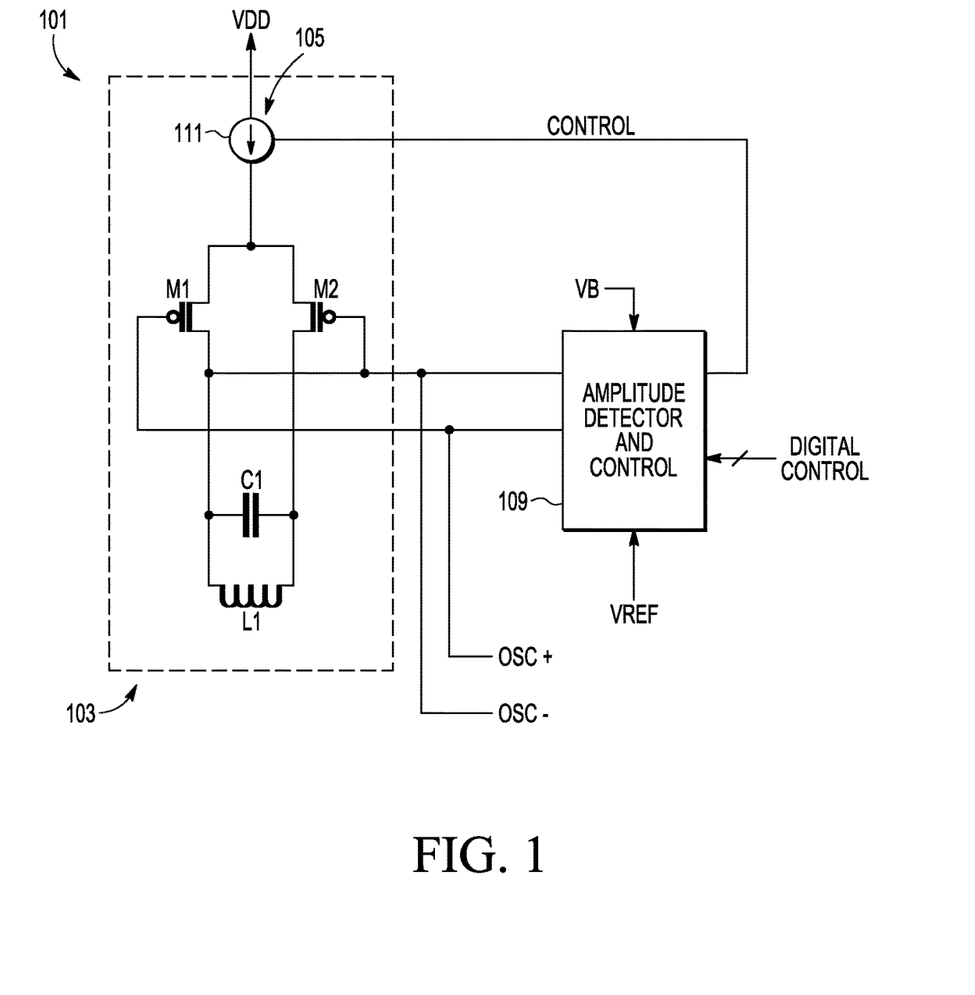
FIG. 1 is a circuit diagram of an oscillator circuit according to one embodiment of the present invention.

FIG. 1 is a circuit diagram of an oscillator circuit 101 according to one embodiment of the present invention. Oscillator circuit 101 includes an oscillator 103 that provides at its output, a differential oscillating signal (OSC+, OSC−) at a frequency determined by the size of capacitor C1 and inductor L. The amplitude of the oscillator output is controlled by a control signal (CONTROL) provided to a current source 111 of oscillator circuit 103 to control the amount of current flowing to the oscillator. The oscillator signal may be used as a clocking signal by other circuitry (not shown) of a system that implements oscillator circuit 101. In one embodiment, oscillator 103 provides a sinusoidal wave differential oscillator signal, but in other embodiments, may provide another type of oscillator signal such as a square wave signal. Also in other embodiments, oscillator circuit 103 may provide a single ended signal. In the embodiment shown, oscillator 103 is an LC type oscillator, but in other embodiments, may be another type of oscillator such as e.g. a crystal oscillator, a ceramic resonator oscillator, a phase-shift oscillator, or a negative resistance oscillator.

The control signal is provided from an amplitude detector and control circuit 109. Circuit 109 receives the oscillator output from oscillator circuit 103, a voltage reference (VREF), a voltage reference (VB), and a digital control signal (DIGITAL CONTROL). In one embodiment, VREF and VB are each provided from a voltage reference source such as a band gap circuit (not shown), but may be provided from another types of voltage reference sources (e.g. a power supply) in other embodiments. In some embodiments, the tolerances for VREF are more stringent than for VB. The digital control signal is indicative of a desired amplitude of the oscillator signal. In one embodiment, the digital control signal is provided by a microcontroller (not shown), but may be provided from other sources (e.g. a set of fuses). In other embodiments, circuit 109 does not receive a digital control signal, wherein the desired amplitude is based on Vref. In one embodiment, oscillator signal has a frequency of 2 GHz but may have other frequencies in other embodiments.

Circuit 109 detects the amplitude of the oscillator signal and compares it to a compared voltage value that is based on the VREF signal and a digital control signal to produce the control signal for adjusting the amplitude of the oscillator signal to match the desired amplitude as indicated by the digital control signal. In one embodiment, the compared voltage value is compensated to account for non-ideal characteristics and process variations of the devices of amplitude detection and control circuit 109.

Figure 2:
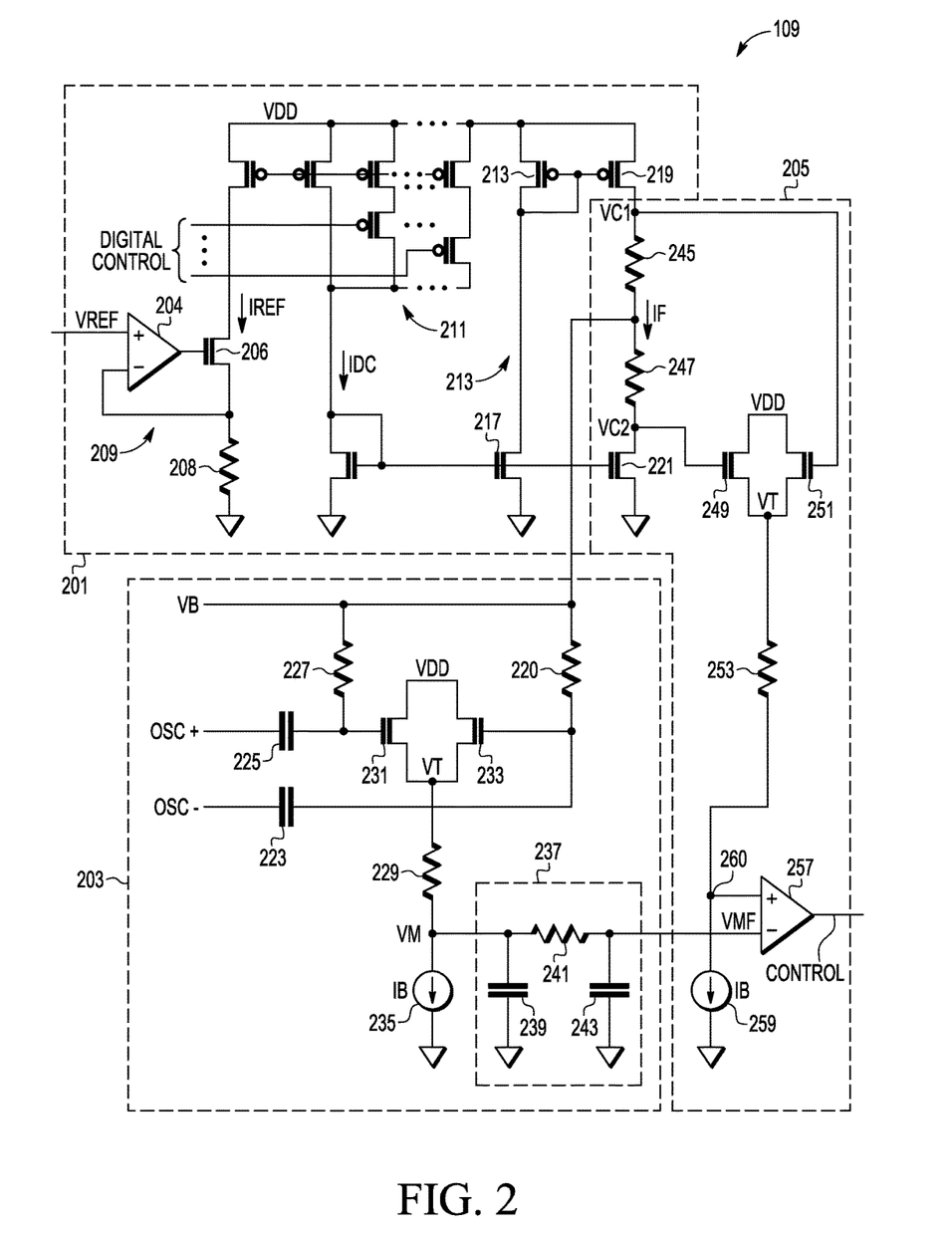
FIG. 2 is a circuit diagram of an amplitude detector and control circuit according to one embodiment of the present invention.

FIG. 2 is a circuit diagram of an amplitude detector and control circuit 109 according to one embodiment of the present invention. Circuit 109 includes an amplitude setting circuit 201, and an amplitude detection circuit 203, and a compensation circuit 205 that produces the control signal that is provided to oscillator 103.

Amplitude setting circuit 201 receives the VREF voltage and the digital control signal and produces a current through resistors 245 and 247 that produces voltages (VC1 and VC2), which are indicative of a desired amplitude of the oscillator signal. In one embodiment, the amplitude of the oscillator circuit is proportional to the voltage differential between VC1 and VC2 in a steady state operation of circuit 101.

The VREF voltage is converted to a current ($I_{REF}$) by V/I converter circuit 209 which includes amplifier 204, resister 208, and NMOS transistor 206. Circuit 201 includes a controlled current mirror 211 that receives the digital control signal and multiples $I_{REF}$ by the number of enabled current paths as per the digital control value that is received by circuit 201. In the embodiment shown, each current path of current mirror 211 includes a PMOS transistor that is controlled by a signal line of the digital control signal. The greater the number of enabled current paths, the higher the resultant multiplied current ($I_{DC}$), and the greater the desired oscillator amplitude that will be produced.

Circuit 201 also includes a current mirror of transistors 213, 217, 219, and 221 that mirror current $I_{DC}$ to produce current $I_F$. Transistor 219 serves as source for the current mirror and transistor 221 serves as a sink for the current mirror. Current $I_F$ is indicative of the desired oscillator amplitude. In other embodiments, the voltage differential between VC1 and VC2 may be generated by other types of circuits including circuits utilizing differential amplifiers.

In the embodiment shown, circuit 109 includes an amplitude detector circuit 203. Amplitude detector circuit 203 includes capacitors 225 and 223, resistors 227 and 220, transistors 231 and 233 (which are coupled in parallel) resistor 229, current source 235, and filter 237. Capacitors 225 and 223 act to block DC bias signals thereby only allowing the oscillating signal to pass to transistors 231 and 233. Depending upon whether the OSC+ or OSC− signal is high during an oscillator cycle, transistor 231 or 233 will be made more conductive to pull the voltage at node VT high. The higher the amplitude of the oscillator signal, the more conductive transistors 231 and 233 will be to pull up the voltage of node VT. The gates of transistors 231 and 233 are biased at voltage VB through resistors 277 and 220, respectively. VB is provided from a reference voltage source (not shown). In one embodiment, VB is 1.0 volts which is less than VDD (e.g. 1.2 volts). In one embodiment, VB is set at a level such that MOSFET transistors 231 and 233 will operate in their saturation regions at the possible amplitude ranges of the oscillator circuit. However, VB may be set at other voltages in other embodiments.

Node VT is located in series with resistor 229 and current source 235 to provide a VM signal whose voltage is indicative of the measured amplitude of the oscillator signal. The VM signal is filtered by filter 237 to remove the higher frequency components to provide for a more stable voltage signal (VMF). Filter 237 includes capacitor 239, resistor 241 and capacitor 243. In one embodiment, filter 237 filters out all components from the VM signal above 10 MHz hertz. In some embodiments, the cutoff frequency is 100 times lower than the frequency of the oscillator signal. Resistor 229 and filter 237 also act to reduce the effect of high frequency components of the voltage at node VT on current source 235.

Circuit 109 includes a comparison circuit 205. Comparison circuit 205 includes resistors 245, 247, and 253, NMOS transistors 249 and 251, current source 259, and amplifier 257. In the embodiment shown, comparison circuit 205 produces a voltage at node 260 from current $I_F$ that is indicative of the desired amplitude and compares it with the VMF signal produced by the amplitude detector circuit 203 (and filtered by filter 237) to adjust the control signal so that the measured amplitude of the oscillator signal (as measured by circuit 203) matches the desired amplitude (as indicated by circuit 201).

Circuit 205 converts the current $I_F$ to a voltage at node 260 with the use of two NMOS transistors 249 and 251. The greater the current $I_F$ (indicating a higher desired amplitude), the higher the voltage at node $V_{C1}$. The higher the voltage $V_{C1}$, the more conductive transistor 251 is to pull node 260 higher towards VDD. The lower the current $I_F$, the lower voltage $V_{C1}$ is to voltage VB. Accordingly, the voltage at node 260 is decreased in that transistor 251 is not as conductive and provides a greater resistance to reduce the voltage at node 260.

In the embodiment shown, transistors 231, 233, 249 and 251 are "equivalent." Equivalent means that the transistors are the same size or substantially the same size. Also, current sources 235 and 259 are equivalent (they are implemented with the same type of devices and produce the same current or substantially the same current). In one embodiment, current sources are designed to produce 10 uA of current. Also, resistors 253 and 229 are equivalent in that they are the same resistance or substantially the same resistance and are the same type of device (e.g. a poly resistor or a MOSFET configured as a resistor). Resistors 245 and 247 are also equivalent. Furthermore, resistor 208 is made out of the same material as resistors 245 and 247.

In other embodiments, transistor 231 and 233 are "matched" with transistors 249 and 251. Matched means that the effective size of one transistor is a multiple integer size of the other transistor. Two transistors that are equivalent are also considered matched. In a situation where one matched transistor is larger than the other, the matched feature can be obtained by either making the channel of the larger transistor physically wider or by implementing a multiple number of transistor devices in parallel where each transistor device is equivalent to the smaller transistor. One advantage that may occur with using multiple equivalent transistor devices in a compensation circuit is that the variance among the multiple transistor devices can be averaged out. This would result in a more accurate compensation by the transistors of the compensation circuit. In such a nonequivalent, matched embodiment where the integer multiple between transistors 249 and 251 and transistors 231 and 233 is X, current source 259 is sized to produce X times more current than current source 235 and resistor 253 is 1/X the size of resistor 229.

In some embodiments, because the amplitude conversion circuit 205 uses the same matched devices (e.g. NMOS transistor 249 and 251, resistor 253, current source 259) to convert current $I_F$ to a voltage at node 260 as the devices (NMOS transistors 231 and 233, resistor 229, and current source 235) used by circuit 203 to detect the amplitude of the oscillator signal, the non ideal aspects of each device (e.g. the transconductance of a MOSFET, process and temperature variations of the transistors, resistors, and current sources) can be factored out when the two voltages (VMF and the voltage at node 260) are compared by amplifier 257. For example, the variations/errors caused by process or temperature characteristics of NMOS transistors 231 and 233 may be reduced or factored out in that NMOS transistors 249 and 251 are used to convert $I_F$ to a voltage at node 260. Accordingly, circuit 109 may provide for a more accurate amplitude control of the oscillator signal, especially at lower amplitude voltages (e.g. 300 mV and less).

Also, in some embodiments, because transistors 231, 233, 249, and 251 are matched, the control signal will be driven such that the amplitude of the oscillator signal (as measured by signal VMF) will be proportional to the voltage drop across the gates of transistors 249 and 251 when oscillator circuit 101 is operating in a steady state.

In some embodiments, circuit 201 may be modified such that V/I converter circuit 209 is omitted. In one such embodiment, a current from a band gap circuit (not shown) would be mirrored by controlled current mirror 211 to produce current $I_{DC}$. With such an embodiment, resistors 245 and 247 would be the same resistor device type as the resistors used to produce the band gap current being mirrored.

Figure 3:
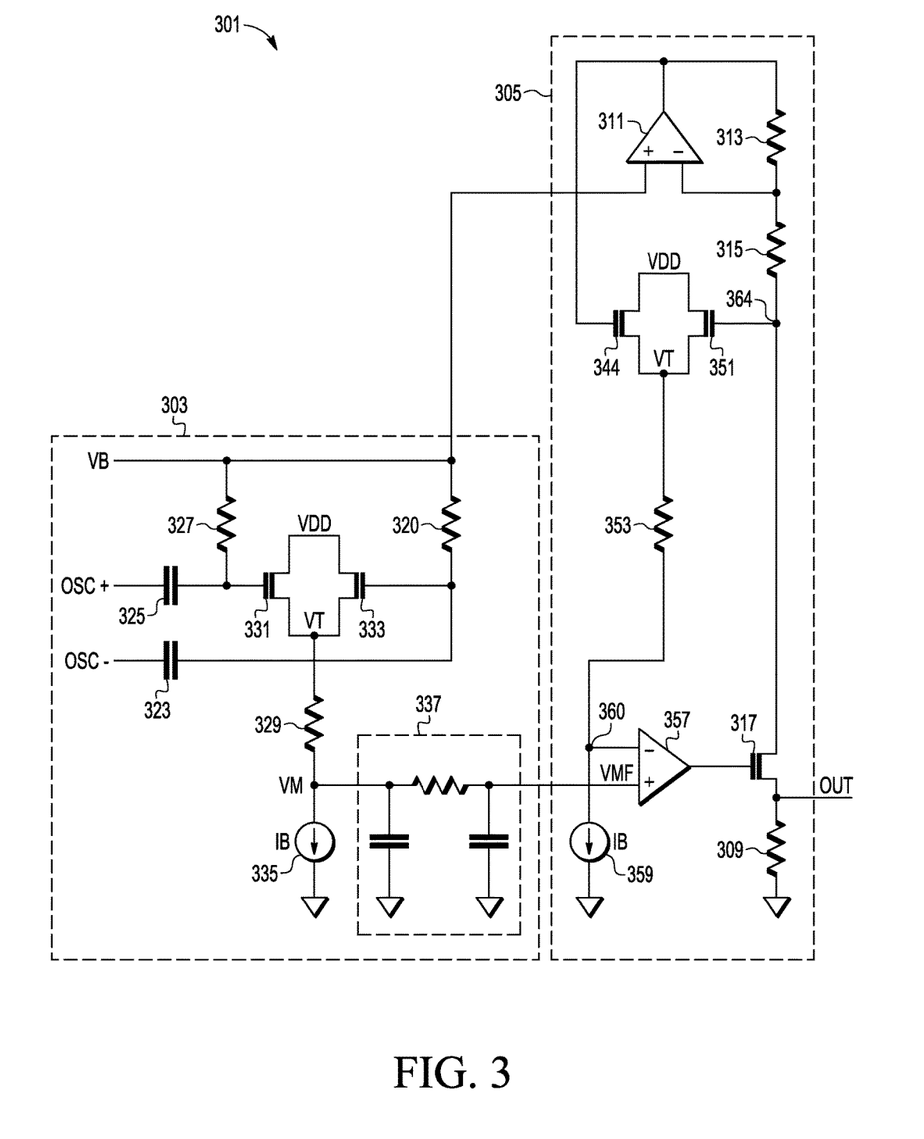
FIG. 3 is a circuit diagram of an amplitude detection circuit according to one embodiment of the present invention.

FIG. 3 is a circuit diagram of an amplitude detection circuit 301 according to one embodiment of the present invention. Detection circuit 301 includes an amplitude detector circuit 303 and a compensation circuit 305. Amplitude detection circuit 301 can be used to detect the amplitude of a signal supplied to the IN+ and IN− input terminals and provide an output signal (OUT) indicative of the measured amplitude. Circuit 301 can be used in, for example, testing circuits where an indication of the amplitude of a signal (e.g. a clocking signal) is desired.

Amplitude detector circuit 303 is similar to amplitude detector circuit 203 of FIG. 2, with capacitors 325 and 323, transistors 331 and 333, resistors 327, 320 and 329, current source 335, and filter 337 serving the same function as capacitors 225 and 223, transistors 231 and 233, resistors 217, 220, and 229, current source 235, and filter 237, respectively. The output of filter 337 produces an signal (VMF) that has a voltage that is indicative of the measured amplitude of the differential signal provided to the input terminals (IN+, IN−).

Compensation circuit 305 receives the signal VMF from detector circuit 303 and adjusts the signal to compensate for the non ideal characteristics of the devices of detector circuit 303. Compensation circuit 305 includes transistors 344 and 351 that are equivalent to transistors 331 and 333. Circuit 305 also includes resistor 353 and current source 359 which are equivalent to resistor 329 and current source 335, respectively. Also, resistors 313, 315, and 309 are of the same device type. Compensation circuit 305 includes resistors 313 and 315 that are connected together at node 314 that is biased at voltage VB by the operation of amplifier 311. Circuit 305 includes amplifiers 311 and 357. The non inverting input of amplifier 357 is coupled to the output of filter 337 and the inverting input is coupled to node 360. Amplifier 357 controls the conductivity of transistor 317, whose drain is connected to resistor 309 and the output node. The output node of circuit 305 produces a compensated output signal (OUT) whose voltage is indicative of the amplitude of the input signal as determined by detector circuit 303 and as compensated by circuit 305.

In operation, the output of amplifier 311 controls the conductivity of transistors 344 and 351. In some embodiments, amplifier 311 operates to assure that transistors 344 and 351 are biased at the same quiescent levels as transistors 331 and 333, while voltages at the output of amplifier 311 and node 364 are maintained symmetrical in relation to node 314 and by consequence Vb. If the voltage of signal VMF is higher than the voltage of node 360, then amplifier 357 will provide a higher voltage at its output which causes NMOS transistor 317 to conduct more. Making transistor 317 more conductive pulls the voltage of nodes 364 and 314 lower which causes a higher voltage at the output of amplifier 311. A higher voltage at the output of amplifier 311 pulls the voltage of node 314 back to VB by causing a larger voltage drop across resistor 313 due to the increased current through the current path of resistor 313, resistor 315, transistor 317 and resistor 309. The higher voltage at the output of amplifier 311 makes transistor 344 more conductive which pulls the voltage at node VT and node 360 higher until the voltage at node 360 matches the voltage of VMF. Making transistor 317 more conductive, pulls the output voltage of the OUT signal higher, indicating that the amplitude of the measured signal is higher than previously indicated.

If the voltage at VMF is less than the voltage at node 360, then the output of amplifier 357 goes lower thereby reducing the conductivity of transistor 317. The reduction of the conductivity of transistor 317 causes the voltage of nodes 364 and 314 to go higher, which causes amplifier 311 to reduce the voltage at its output to bring node 314 back to VB. The reduction in voltage of the output of amplifier 311 makes transistor 344 less conductive thereby reducing the voltage at node VT and the voltage at node 360 until the voltage at node 360 matches VMF. The voltage at node 364 is increased by the reduction in conductivity of transistor 317 due to the reduction in current flowing through resistor 315. However, the decrease in conductivity of transistor 344 causes the voltage of node VT to decrease more than the increase in conductivity of transistor 351.

If no signal were provided to the input (In+, In1), the gates of transistors 331 and 333 would be biased at VB. In such a condition, the voltage of VMF would be reduced to a minimum value. The voltage at node 360 would corresponding be driven to the same minimum value and the output of amplifier 357 would be reduced to the point of turning off transistor 317. With amplifier 357 turned off, no current would flow across resistors 313, 315, and 309. Accordingly node 364 and node 314 would both be biased at VB and the voltage out the output would be 0 volts. At this point, any increase in the amplitude of the signal being measured, would cause voltage VMF to increase and the voltage at node 360 would follow accordingly. Because matched transistors are used and the gates of the transistors initially are being biased VB, the voltage at node 360 tracks the voltage VMF in the same manner even at relatively low voltages of the amplitude signal.

The voltage differential between the gates of transistors 344 and 351 is set by the voltage drop across resistors 313 and 315 which is controlled by the conductivity of transistor 317. This same current sets of the voltage of the output signal (OUT). Transistors 331 and 333 are utilized to create a DC voltage that indicates the amplitude of the oscillating signal (after filtering). The compensation circuit 305 utilizing matched transistors 344 and 351 to produce a DC voltage to match VMF requires that a differential voltage across the gates of transistor 344 and 351 be proportional to the amplitude of the input signal. With resistors 313, 315, and 309 being in the same current path, the output signal can be determined from a node (OUTPUT) of that current path. However, in some embodiments, the output could be derived using a current path that is mirrored with the current path of resistors 313 and 315.

In the embodiments of FIGS. 2 and 3, the amplitude detection circuits detect the amplitude of differential signals. However, these circuits can also be modified to detect the amplitude of single ended signals as well.

Figure 4:
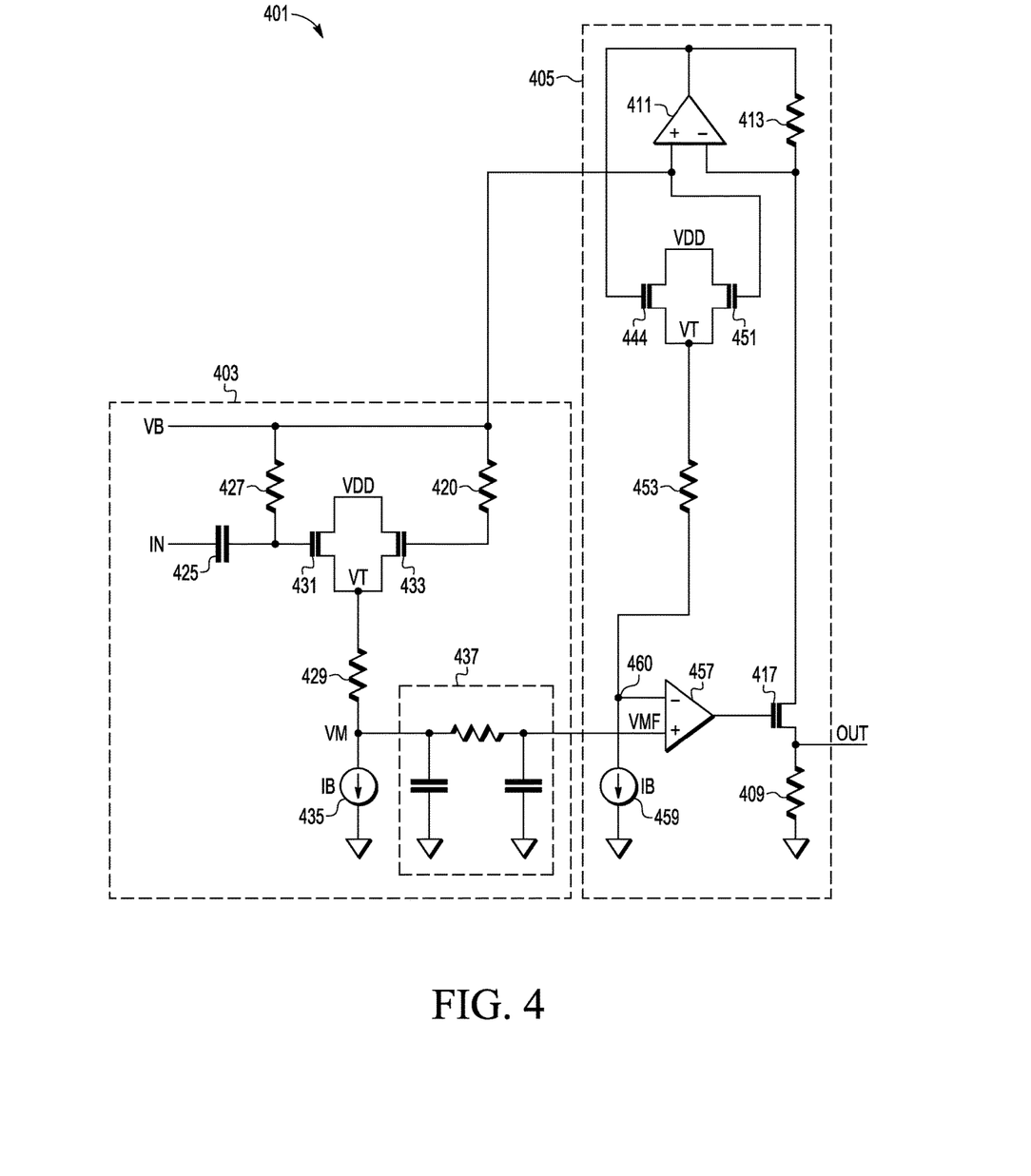
FIG. 4 is a circuit diagram of an amplitude detection circuit according to another embodiment of the present invention.

FIG. 4 is a circuit diagram of an amplitude detection circuit 401 that is similar to amplitude detection circuit 301 except that circuit 401 detects the amplitude of a single ended signal received at the input terminal (IN). Amplitude detector circuit 403 is similar to detector circuit 303 except that the gate of transistor 433 is connected only to resistor 420 whereas the gate of transistor 333 of circuit 303 is connected to input terminal IN– as well as resistor 320. Also, circuit 403 does not include a capacitor similar to capacitor 323. Otherwise, capacitor 425, resistors 427, 420, and 429, transistors 431 and 433, current source 435, and filter 437 are similar to capacitor 325, resistors 327, 320, and 329, transistors 331 and 333, current source 335, and filter 337. In some embodiments, resistor 420 may be omitted.

Compensation circuit 403 is similar to compensation circuit 303 except that the gate of transistor 451 is biased by voltage VB instead of by node 364. Also, circuit 405 does not include a resistor similar to resistor 315. Otherwise, amplifiers 411 and 457, transistors 444, 451 and 417, resistors 413, 409, and 453, and current source 459 are similar to amplifiers 311 and 357, transistors 344, 351 and 317, resistors 313, 309, and 353, and current source 359.

Circuit 405 operates in a similar manner to circuit 305 except that the gate of transistor 451 is biased at a constant VB and the voltage drop between the gate of transistor 444 and transistor 451 is set by the voltage drop across resistor 413. The voltage of the output signal is proportional to the voltage drop across resistor 413, which at a steady state operation is indicative of the amplitude of the input signal.

Circuit 109 can also be modified where circuit 109 can control the amplitude of an oscillator signal by detecting the amplitude of a single ended oscillator signal. Referring back to FIG. 2, in one example of a single ended embodiment, resistor 247 and capacitor 223 would be omitted. In such an embodiment, the gate of transistor 249 would be tied to node VB, and the gate of transistor 233 would only be connected to resistor 220 (or alternatively connected to VB with resistor 220 omitted) in that the OSC– terminal would not exist. In such an embodiment, the control signal would be driven to a value in steady state such the amplitude of the oscillator signal would be proportional the voltage drop across resistor 245. In some single ended embodiments, transistor 221 would be omitted.

In other embodiments, amplitude detectors and control circuits may have other configurations and/or made include other devices. For example, the amplitude detector circuits 203, 303, and 403 as well as compensation circuits 205, 305, and 405 may include pairs of bipolar transistors in place of the pairs of MOSFET transistors (e.g. transistors 231 and 233 and transistors 249 and 251) shown in FIGS. 2-4. Because of the larger transconductance of a bipolar transistor, some such embodiments may be able to accurately detect the amplitude of a signal in the 10s mV range and lower. With a MOSFET, the gate is a control terminal and the source and drain regions are the current terminals. With a bipolar transistor, the base is the control terminal and the emitter and collector are the current terminals.

In some embodiments, the detector and compensation circuits shown or described herein can be used in an automatic gain control circuit (AGC) to amplify a signal to a desired amplitude that is monitored by the detector circuit where the compensation circuit output is used to adjust the amplifier gain in a closed loop fashion.

In one embodiment, a circuit includes an amplitude detector. The amplifier detector includes an input to receive a signal having an amplitude voltage and a first pair of transistors configured in parallel. The input is coupled to a control terminal of at least one transistor of the first pair. The amplitude detector includes a first node providing a voltage indicative of the amplitude voltage. The first node is in series with each of the first pair of transistors. The circuit includes a compensation circuit. The compensation circuit includes a second pair of transistors configured in parallel and a second node. The second node is coupled in series with each transistor of the second pair. The compensation circuit includes an amplifier including a first amplifier input coupled to the first node and a second amplifier input coupled to the second node.

In another embodiment, an oscillator circuit includes an oscillator having an output to produce an oscillator signal and a control input to control an amplitude of the oscillator signal. The oscillator circuit includes an amplitude detector. The amplitude detector includes a first current path. The first current path includes a first node to provide a voltage indicative of an amplitude of the oscillator signal. The amplitude detector includes a first pair of transistors. Each transistor of the first pair of transistors is coupled in series with the first current path. The first pair of transistors is coupled in parallel. The amplitude detector includes an input to receive the oscillator signal. The input includes a first input terminal coupled to a control terminal of a transistor of the first pair of transistors. The oscillator includes a compensation circuit. The compensation circuit includes a second current path. The compensation circuit includes a second pair of transistors. Each transistor of the second pair of transistors is coupled in series with the second current path. The second pair of transistors is coupled in parallel. The second pair of transistors includes a first transistor having a control terminal and a second transistor having a control terminal. The compensation circuit includes a circuit for setting a voltage differential between the control terminal of the first transistor and the control terminal of the second transistor of the second pair of transistors. The compensation circuit includes an output for controlling the amplitude of the oscillator signal coupled to the control input. Wherein during a steady state condition, the amplitude of the oscillator signal is proportional to the voltage differential.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A circuit comprising:
   an amplitude detector comprising:
      an input to receive a signal having an amplitude voltage;

a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node, wherein the first amplifier input is one of an inverting input or a non inverting input of the amplifier, wherein the second amplifier input is an other of the inverting input or the non inverting input of the amplifier.

2. The circuit of claim 1 wherein in a steady state condition, a voltage differential across control terminals of the second pair of transistors is proportional to the amplitude voltage of the signal.

3. A circuit comprising:
an amplitude detector comprising:
an input to receive a signal having an amplitude voltage;
a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node;
wherein an output of the amplifier is configured to adjust a voltage of the second amplifier input to match a voltage of the first amplifier input.

4. A circuit comprising:
an amplitude detector comprising:
an input to receive a signal having an amplitude voltage;
a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node;
wherein an output of the amplifier is configured to adjust a voltage of the first amplifier input to match a voltage of the second amplifier input.

5. The circuit of claim 1 further comprising an amplitude setting circuit, where each control terminal of the second pair of transistors is biased at a voltage set by the amplitude setting circuit.

6. The circuit of claim 5 wherein the amplitude setting circuit produces a current through a set of devices coupled in series in a current path, wherein the current is indicative of a desired amplitude voltage, wherein a control terminal of one transistor of the second pair of transistors is biased at one node of the current path and a control terminal of a second transistor of the second pair of transistors is biased at another node of the current path.

7. The circuit of claim 1 wherein the first pair of transistors and the second pair of transistors are characterized as MOSFETs.

8. The circuit of claim 1 wherein the first pair of transistors are matched with the second pair of transistors.

9. The circuit of claim 1, wherein:
the first pair of transistors is coupled in series with a first current path, the first node is a node of the first current path, the first current path includes a first current source coupled in series with the first pair of transistors and the first node;
the second pair of transistors is coupled in series with a second current path, the second node is a node of the second current path, the second current path includes a second current source coupled in series with the second pair of transistors and the second node.

10. The circuit of claim 9 wherein the first current source and the second current source are equivalent.

11. A circuit comprising:
an amplitude detector comprising:
an input to receive a signal having an amplitude voltage;
a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node;
wherein:
the first pair of transistors is coupled in series with a first current path, the first node is a node of the first current path, the first current path includes a first current source coupled in series with the first pair of transistors and the first node;
the second pair of transistors is coupled in series with a second current path, the second node is a node of the second current path, the second current path includes a second current source coupled in series with the second pair of transistors and the second node;
the first current source and the second current source are equivalent;
the first current path includes a first resistive element in the first current path coupled between the first pair of transistors and the first node;
the second current path includes a second resistive element in the second current path coupled between the second pair of transistors and the second node.

12. The circuit of claim 11 wherein the second current source produces X times the current as the first current source and the second resistive element is 1/X times the resistance of the first resistive element.

13. A circuit comprising:
an amplitude detector comprising:
an input to receive a signal having an amplitude voltage;
a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node;
a filter circuit having an input coupled to the first node and an output coupled to the first amplifier input, the first node is coupled to the first amplifier input through the filter circuit, the filter circuit configured to filter out higher frequency components of the voltage indicative of the amplitude voltage.

14. The circuit of claim 1 wherein the signal is a differential signal, wherein the input includes a first input terminal coupled to a control terminal of a first transistor of the first pair of transistors, the input includes a second input terminal coupled to a control terminal of a second transistor of the first pair of transistors.

15. A circuit comprising:
an amplitude detector comprising:
an input to receive a signal having an amplitude voltage;
a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node;
wherein a control terminal of a first transistor of the first pair of transistors is coupled to a bias voltage source through a first resistive element, a control terminal of a second transistor of the first pair of transistors is coupled to the bias voltage source, a control terminal of a transistor of the second pair of transistors is coupled to the bias voltage source, wherein a current terminal of each transistor of the first pair of transistors and the second pair of transistors is coupled to a high voltage supply terminal, wherein a supply voltage of the high voltage supply terminal is higher than a bias voltage of the bias voltage source.

16. The circuit of claim 15 wherein the compensation circuit includes a second amplifier having a first input coupled to the bias voltage source and an output coupled to a control terminal of a transistor of the second pair of transistors to control a conductivity of the transistor of the second pair of transistors.

17. The circuit of claim 1 further comprising:
a transistor having a control terminal, wherein an output of the amplifier is coupled to the control terminal to control a conductivity of the transistor, wherein the circuit includes an output providing an indication of the amplitude voltage of the signal, wherein the output is coupled to a current terminal of the transistor.

18. A circuit comprising:
an amplitude detector comprising:
an input to receive a signal having an amplitude voltage;
a first pair of transistors configured in parallel, the input is coupled to a control terminal of at least one transistor of the first pair;
a first node providing a voltage indicative of the amplitude voltage, wherein the first node is in series with each of the first pair of transistors;
a compensation circuit comprising:
a second pair of transistors configured in parallel;
a second node, the second node is coupled in series with each transistor of the second pair;
an amplifier including a first amplifier input coupled to the first node and a second amplifier input coupled to the second node;
wherein the signal is a single ended signal, wherein the input includes an input terminal coupled to a control input of a first transistor of the first pair of transistors, wherein a control terminal of a second transistor of the first pair of transistors is coupled to a voltage reference source, wherein a control terminal of a transistor of the second pair of transistors is coupled to the voltage reference source.

19. The circuit of claim 1 wherein the input of the amplitude detector is coupled to an output of an oscillator circuit to receive an oscillator signal, wherein the signal is the oscillator signal, and an output of the amplifier controls an amplitude voltage of the oscillator signal.

20. An oscillator circuit comprising:
an oscillator having an output to produce an oscillator signal and a control input to control an amplitude of the oscillator signal;
an amplitude detector comprising:
a first current path, the first current path including a first node to provide a voltage indicative of an amplitude of the oscillator signal;
a first pair of transistors, each transistor of the first pair of transistors is coupled in series with the first current path, the first pair of transistors is coupled in parallel;
an input to receive the oscillator signal, the input includes a first input terminal coupled to a control terminal of a transistor of the first pair of transistors;
a compensation circuit comprising:
a second current path;
a second pair of transistors, each transistor of the second pair of transistors is coupled in series with the second current path, the second pair of transistors is coupled in parallel, the second pair of transistors includes a first transistor having a control terminal and a second transistor having a control terminal;
a circuit for setting a voltage differential between the control terminal of the first transistor and the control terminal of the second transistor of the second pair of transistors;
an output for controlling the amplitude of the oscillator signal coupled to the control input, wherein during a steady state condition, the amplitude of the oscillator signal is proportional to the voltage differential.

* * * * *